(12) United States Patent
Asai et al.

(10) Patent No.: US 7,986,075 B2
(45) Date of Patent: Jul. 26, 2011

(54) FILM BULK ACOUSTIC WAVE RESONATOR, ITS FABRICATION METHOD AND FILM BULK ACOUSTIC WAVE RESONATOR FILTER USING THE RESONATOR

(75) Inventors: Kengo Asai, Hachioji (JP); Hisanori Matsumoto, Kokubunji (JP); Atsushi Isobe, Kodaira (JP)

(73) Assignee: Hitachi Media Electronics Co., Ltd., Iwate (JP)

( * ) Notice: Subject to any disclaimer, the term of this patent is extended or adjusted under 35 U.S.C. 154(b) by 20 days.

(21) Appl. No.: 12/292,448

(22) Filed: Nov. 19, 2008

(65) Prior Publication Data

US 2009/0127978 A1      May 21, 2009

(30) Foreign Application Priority Data

Nov. 19, 2007   (JP) ................. 2007-299126

(51) Int. Cl.
   *H01L 41/08* (2006.01)
(52) U.S. Cl. ................... 310/324; 310/320
(58) Field of Classification Search ........... 310/320, 310/324
   See application file for complete search history.

(56) References Cited

U.S. PATENT DOCUMENTS

| | | | |
|---|---|---|---|
| 7,005,946 B2* | 2/2006 | Duwel et al. | 333/187 |
| 7,378,922 B2* | 5/2008 | Kubo et al. | 333/189 |
| 2005/0012571 A1* | 1/2005 | Song et al. | 333/192 |
| 2007/0194863 A1* | 8/2007 | Shibata et al. | 333/187 |
| 2009/0115553 A1* | 5/2009 | Shin et al. | 333/188 |
| 2009/0127978 A1* | 5/2009 | Asai et al. | 310/322 |

FOREIGN PATENT DOCUMENTS

| | | |
|---|---|---|
| JP | 2006-295380 | 4/2005 |
| JP | 2006-352854 | 5/2006 |

OTHER PUBLICATIONS

R. Ruby et al., "Micromachines Thin Film Bulk Acoustic Resonators", 1994 IEEE International Frequency Control Symposium, pp. 135-138.

* cited by examiner

*Primary Examiner* — Mark Budd
(74) *Attorney, Agent, or Firm* — Stites & Harbison PLLC; Juan Carlos A. Marquez, Esq.

(57) ABSTRACT

The film bulk acoustic wave resonator includes a laminate structure composed of a piezoelectric layer, and first and second electrode layers interposing at least part of the piezoelectric layer, in which the first metal electrode is dispersively formed on an electrode plane facing the second metal electrode, and a gap is formed in a substrate correspondingly to the laminate-structured resonance part. Except for an area of a wire electrode electrically connected to the first electrode layer and an area of a wire electrode electrically connected to the second electrode layer, the piezoelectric layer, first electrode layer and second electrode layer do not come in contact with the insulating substrate but are supported on a hollow. Also, a prop is formed in the gap to support the laminate structure.

18 Claims, 16 Drawing Sheets

FILM BULK ACOUSTIC WAVE RESONATOR, ITS FABRICATION METHOD AND FILM BULK ACOUSTIC WAVE RESONATOR FILTER USING THE RESONATOR

CLAIM OF PRIORITY

The present application claims priority from Japanese patent application JP2007-299126 filed on Nov. 19, 2007, the content of which is hereby incorporated by reference into this application.

BACKGROUND OF THE INVENTION

1. Field of the Invention

The present invention relates to a resonator using piezoelectric/anti-piezoelectric effects of a piezoelectric layer as well as a resonance phenomenon of a bulk acoustic wave (hereinafter referred to as a "film bulk acoustic wave resonator"), a film bulk acoustic wave resonator filter using such a resonator, and a fabrication method thereof.

2. Description of the Related Arts

In general, a film bulk acoustic wave resonator includes a resonance part having a piezoelectric layer, and first and second metal films, each being obtained by a film forming apparatus, in which the first and second metal films interpose at least part of the piezoelectric layer from above and below. The first metal film serves as an upper electrode and the second metal film serves as a lower electrode. The piezoelectric layer is polarized in its thickness direction. An AC electric field generated by an AC voltage applied between the upper electrode and the lower electrode causes an acoustic wave (i.e., expansion and contraction in the thickness direction of the piezoelectric layer) under piezoelectric/anti piezoelectric effects.

The resonance part composed of the piezoelectric layer, upper electrode, and lower electrode is vertically interposed by acoustic insulators to confine bulk acoustic waves inside the piezoelectric layer. Because the interface between solid and gas (or vacuum) functions as an efficient acoustic wave insulator, an FBAR (Film Bulk Acoustic wave Resonator) having gas (or vacuum) atmosphere above and below is widely known. The basic configuration of a film bulk acoustic wave resonator is disclosed in Japanese Patent Application Laid-Open No. 2006-295380 and 1994 IEEE International Frequency Control Symposium, pp. 135-138, where a resonance part is supported on a hollow by a support layer. In addition, Japanese Patent Application Laid-Open No. 2006-352854 disclosed a resonator configuration where a resonance part is supported on a hollow by a piezoelectric layer.

SUMMARY OF THE INVENTION

Although a film bulk acoustic wave resonator generally is characterized by having a high Q factor, a higher Q factor is yet required to meet increasing needs of low-loss filters. In order to obtain a high Q factor, it is important to effectively trap bulk acoustic waves in the resonance part composed of a piezoelectric layer and upper/lower electrode layers. As for the configuration of a film bulk acoustic wave resonator, it is known that FBARs which perform acoustic insulation by having the atmosphere (or vacuum) below the lower electrode are more likely to increase the reflection rate of acoustic waves than SMRs (Solidly Mounted Resonators) which perform acoustic insulation by disposing a Bragg reflector underneath the lower electrode, therefore advantageous to obtain a high Q factor. However, the following problems are found in film bulk acoustic wave resonators used in radio frequency band as disclosed in Japanese Patent Application Laid-Open Nos. 2006-295380 and 2006-352854, and 1994 IEEE International Frequency Control Symposium, pp. 135-138.

A film bulk acoustic wave resonator described either in Japanese Patent Application Laid-Open No. 2006-295380 or 1994 IEEE International Frequency Control Symposium, pp. 135-138 has a configuration that a resonance part composed of an upper electrode and a lower electrode interposing a piezoelectric layer between them is earthed with an insulating substrate via a support layer. Since it is difficult to completely get rid of the leakage path of a bulk acoustic wave towards the insulating substrate merely by interposing the support layer, it also becomes hard to completely trap a bulk acoustic wave inside the resonator and to obtain good resonance characteristics.

In addition, another film bulk acoustic wave resonator described in Japanese Patent Application Laid-Open No. 2006-352854 has a configuration that a resonance part composed of an upper electrode and a lower electrode interposing a piezoelectric layer between them is supported as the piezoelectric layer covers a hollow portion. In this configuration, since the resonance part is connected with an insulating substrate by the piezoelectric layer, a bulk acoustic wave leaks towards an insulating substrate via the interposed piezoelectric layer. Therefore, again, it comes hard to completely trap a bulk acoustic wave inside the resonator and to obtain good resonance characteristics.

A primary object of the present invention is to solve the prior art problems with the resonator configuration described above, by providing a film bulk acoustic wave resonator with an energy trapping structure which enables to keep a leakage path of bulk acoustic waves towards an insulating substrate to the minimum, a radio frequency filter using such a resonator, and a fabrication method thereof.

In an exemplary embodiment of the prevent invention, a film bulk acoustic wave resonator includes a laminate structure, which includes a piezoelectric layer, and first and second electrode layers interposing at least part of a main surface and part of a counter surface facing the main surface of the piezoelectric layer, formed on an insulating substrate; a first wire electrode electrically connected to the first electrode layer; a second wire electrode electrically connected to the second electrode layer; and an air gap, which is formed in the insulating substrate and which has an opening on a surface side of the insulating substrate, wherein one of the first and second wire electrodes is connected to the insulating substrate, and wherein the laminate structure is connected to the insulating substrate by interposing a prop that is formed in the air gap.

In another aspect, the second electrode layer is disposed at an outer side of the insulating substrate than the first electrode layer, and the second electrode layer has a hole without a electrode layer to form the second electrode layer at a location in the second electrode layer, the location being found in a place where a virtual line extended from the prop crosses the second electrode layer.

In still another aspect, a diameter of the hole, hu, and a diameter of the prop, d, satisfy a condition of hu>d.

In still another aspect, the second electrode layer is disposed at an outer side of the insulating substrate than the first electrode layer, the first electrode layer has a first hole without a electrode layer to form the first electrode layer at a location in the first electrode layer, the location being found in a place where a virtual line extended from the prop crosses the first electrode layer, and the second electrode layer has a second hole without a electrode layer to form the second electrode layer at a location in the second electrode layer, the location being found in a place where a virtual line extended from the prop crosses the second electrode layer.

In yet another aspect, a diameter of the first hole, hd, a diameter of the second hole, hu, and diameter of the prop, d, satisfy a condition of hu>hd>d.

In accordance with the present invention, the resonance part composed of an upper electrode layer and a lower electrode layer interposing a piezoelectric layer between them is configured in such a way that it is not supported by having the support layer or the piezoelectric layer cover a hollow and that reinforcing props are disposed underneath the resonator to ensure its strength. Accordingly, connection between the resonator and the insulating substrate can be minimized, and the leakage of bulk acoustic waves towards the insulation substrate can be suppressed. Moreover, as bulk acoustic waves are trapped effectively inside the resonator, a resonator with a high Q factor and a low-loss filter can be achieved.

DETAILED DESCRIPTION OF THE PREFERRED EMBODIMENTS

Reference will now be made in detail to the preferred embodiments of the present invention, examples of which are illustrated in the accompanying drawings. The following explains cases where the present invention is targeted for an FBAR, whose resonant frequency is a radio frequency of 1 Hz or higher and is determined by the film thickness of a resonance part.

Embodiment 1

Figure 1A:
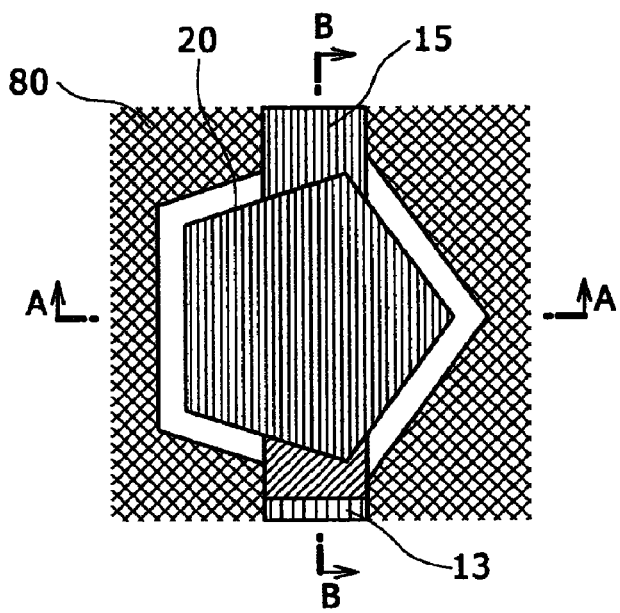
FIG. 1A is a plan view showing one example of a film bulk acoustic wave resonator as a first embodiment according to the present invention.
Figure 1B:
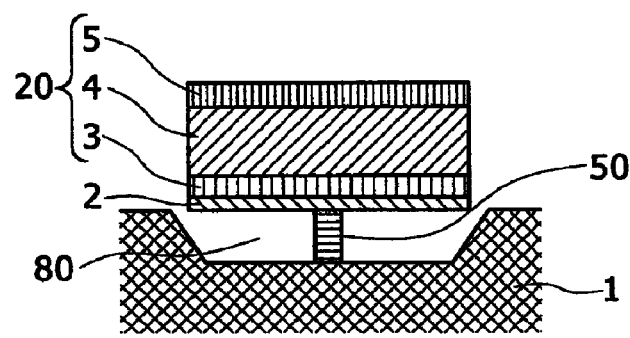
FIGS. 1B and 1C are cross-sectional views thereof.
Figure 1C:
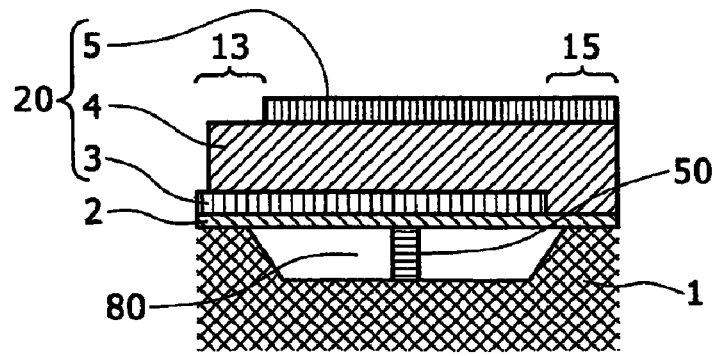

FIG. 1A is a top schematic view of a film bulk acoustic wave resonator according to a first embodiment, and FIGS. 1B and 1C each show a cross-sectional schematic view of the film bulk acoustic wave resonator according to the first embodiment. In detail, the FIG. 1B is a sectional view taken along line A-A in FIG. 1A, and FIG. 1C is a sectional view taken along line B-B in FIG. 1A. An FBAR-type film bulk acoustic wave resonator is formed on an insulating substrate 1. A laminate-structured resonance part 20 of this FBAR-type film bulk acoustic wave resonator has a laminate structure including a piezoelectric layer 4, and a pair of electrode layers (a first electrode layer 3 and a second electrode layer 5) interposing at least part of the piezoelectric layer 4 between them.

In the first embodiment of the invention, the insulating substrate 1 is a high-resistance silicon substrate, the first and second electrode layers 3 and 5 are each composed of a molybdenum film obtained by a film forming apparatus, and the piezoelectric layer 4 is composed of aluminum nitride. Needless to say, any substrate made of some other insulating material, such as a glass substrate, can be used for the insulating substrate 1. Also, it is needless to say any piezoelectric material selected from ZnO, PZT, PbTiO$_3$, and BaTiO$_3$ can be used for the piezoelectric layer 4. Further, it is needless to say that any conducting material selected from Ta, Ni, Nb, Au, Pt, Cu, Al, Pd, Ti, and W may be used for the first electrode layer 3 and the second electrode layer 5.

The film forming apparatus mentioned in this specification is an apparatus, such as a sputtering apparatus, a vapor deposition apparatus, or a CVD apparatus, that forms films by depositing molecules, atoms, ions, or clusters thereof directly on a substrate, or by doing so while causing a chemical reaction. The film mentioned in this specification is a film formed by such a film forming apparatus and such films do not include sintered compacts created by sintering or bulk materials formed by the hydrothermal method, the Czochralski method, or the like, regardless of the thickness thereof.

Referring now to FIG. 1, one example of a film bulk acoustic wave resonator according to a first embodiment of the present invention will be described. In the first embodiment, the film bulk acoustic wave resonator includes a laminate-structured resonance part 20 which is formed on an insulating substrate 1 and composed of a piezoelectric layer 4, a first electrode layer 3 serving as a lower electrode, and a second electrode layer 5 serving as an upper electrode, the first and second electrode layers interposing at least part of the piezoelectric layer 4 between them. The first metal electrode 3 is dispersively formed on an electrode plane facing the second metal electrode 5, and a gap 80 is formed in the insulating substrate 1 in an area correspondingly to the laminate-structured resonance part 20. Except for an area of a wire electrode 13 electrically connected to the first electrode layer 3 and an area of a wire electrode 15 electrically connected to the second electrode layer 5, the laminate-structured resonance part 20 does not come in contact with the insulating substrate 1 but is supported on a hollow. In addition, a prop 50 is arranged in the gap 80. For ease of viewing, in FIGS. 1B and 1C, the prop 50 is represented in much larger size than its actual size.

In the first embodiment, as noted before, the insulating substrate 1 made of high-resistance silicon has the gap 80, and the prop 50 with 2 µm diameter is formed at the center of the gap 80. In this embodiment, the prop 50 is formed by leaving out a portion of the high-resistance silicon substrate at the time of forming the gap 80 in the high-resistance silicon substrate. This method does not require a separate process for forming the prop 50 and is the most inexpensive method, but, needless to say, a separate process can always be added therefor. It is also needless to say that the prop 50 may be made of other insulating material or conducting material, besides the insulating substrate 1.

In a more specific example, the laminate-structured resonance part 20 is composed of 30 nm AlN is disposed as a support layer 2, 400 nm Mo as the first electrode layer 3, 950 nm AlN as the piezoelectric layer 4, and 400 nm Mo as the second electrode layer 5, and the prop 5 is arranged at the center of the laminate-structured resonance part 20. The wire electrode 13 which is electrically connected to the first electrode layer 3, together constituting the lower electrode, and the wire electrode 15 which is electrically connected to the second electrode layer 5, together constituting the upper electrode are connected to the laminate-structured resonance part 20 in width of 40 µm. Besides the prop 50, the wire electrodes 13 and 15 are the only areas where the laminate-structured resonance part 20 contacts the insulating substrate 1, such that, in the other areas, the laminate-structured resonance part 20 does not come in contact with the insulating substrate 1 but is supported on the hollow.

Figure 2A:
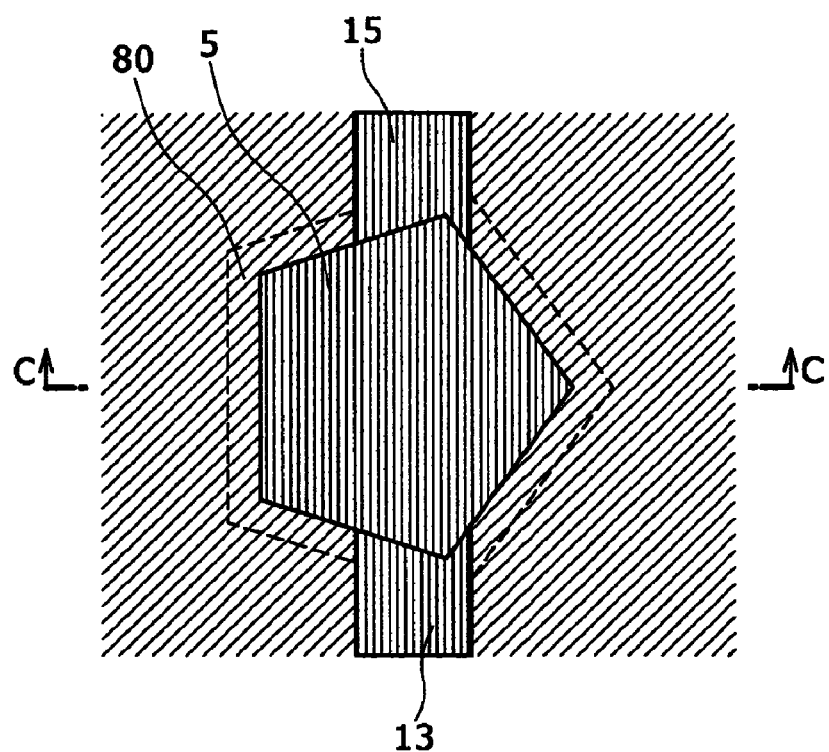
FIG. 2A is a plan view showing one example of a film bulk acoustic wave resonator of prior art.
Figure 2B:
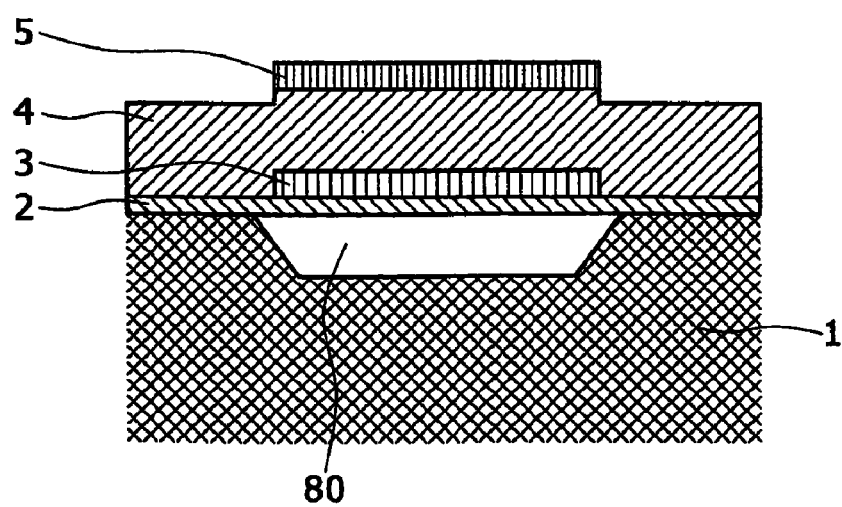
FIG. 2B is a cross-sectional view thereof.

FIG. 2A is a top schematic view of a film bulk acoustic wave resonator of prior art, FIG. 2B is a cross-sectional schematic view of the film bulk acoustic wave resonator in FIG. 2A, and is a cross-sectional view taken along line C-C in FIG. 2A. Referring to FIGS. 2A and 2B, one example of a film bulk acoustic wave resonator of prior art will be described. The film bulk acoustic wave resonator includes a laminate-structured resonance part 20 which is formed on an insulating substrate 1 and composed of a piezoelectric layer 4, a first electrode layer 3 serving as a lower electrode, and a second electrode layer 5 serving as an upper electrode, the first and second electrode layers interposing at least part of the piezoelectric layer 4 between them. The first metal electrode 3 is dispersively formed on an electrode plane facing the second metal electrode 5, and a gap 80 is formed in the insulating substrate 1 in an area correspondingly to the laminate-structured resonance part 20. Meanwhile, in this laminate-structured resonance part 20 the gap 80 formed in the insulating substrate 1 is covered the piezoelectric layer 4 and a support layer 2.

Figure 3:
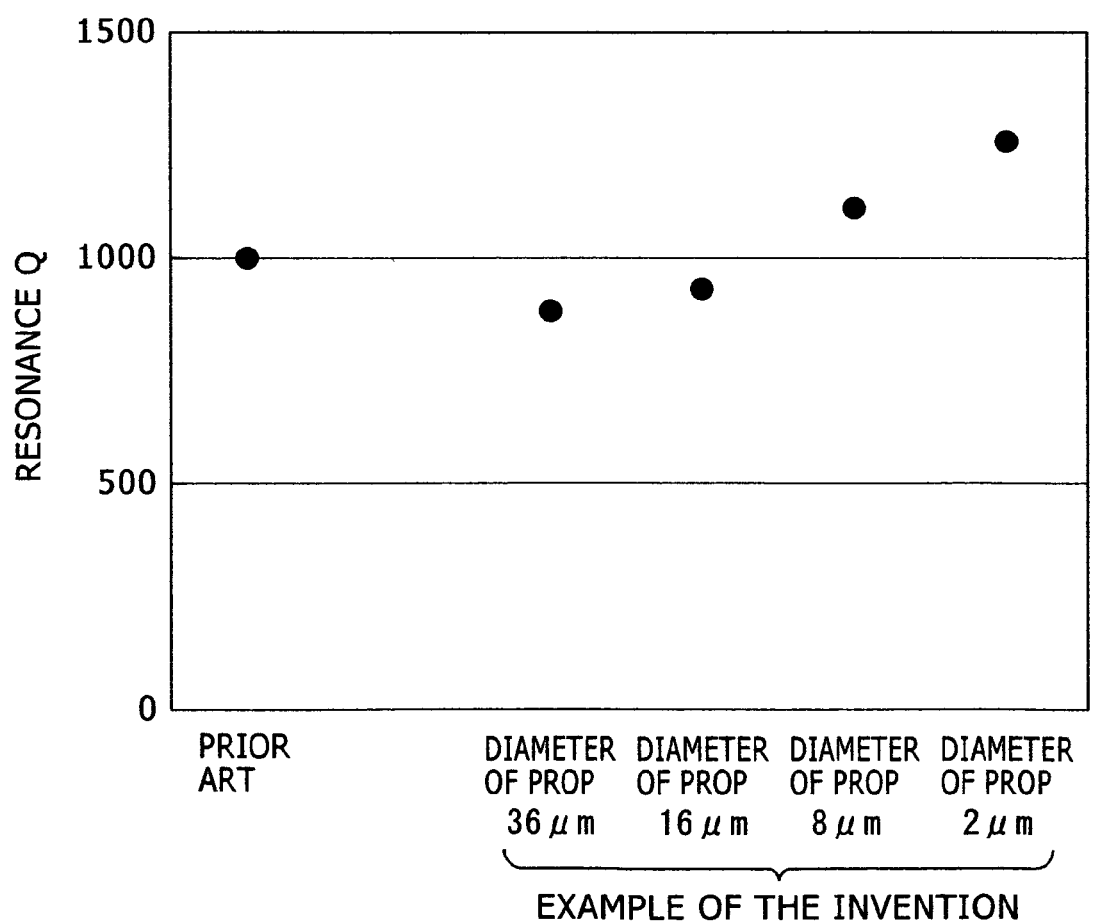
FIG. 3 shows a quality factor at resonant frequency of the film bulk acoustic wave resonator of the first embodiment according to the present invention.
Figure 4A:
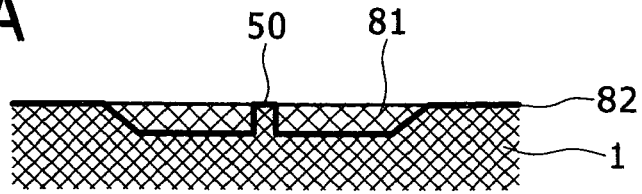
FIGS. 4A to 4F are cross-sectional configurational views to sequentially explain an example of the fabrication method of the film bulk acoustic wave resonator as the first embodiment of the present invention.
Figure 4B:
Figure 4C:
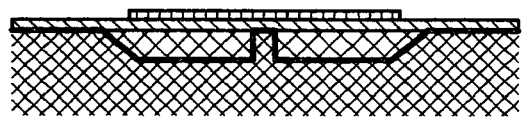
Figure 4D:
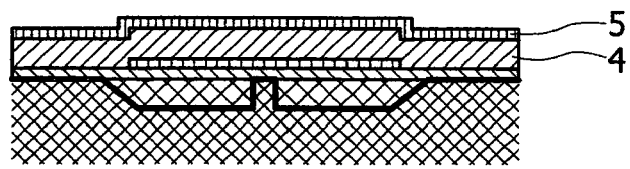
Figure 4E:
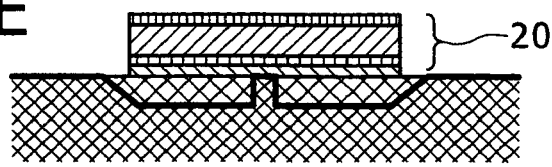
Figure 4F:
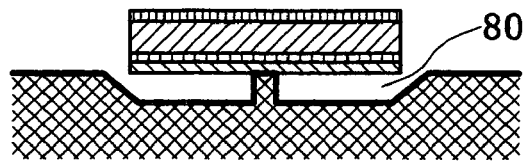

FIG. 3 shows quality factor (resonance Q) at resonance frequency of the film bulk acoustic wave resonator according to the first embodiment of the present invention in FIGS. 1A to 1C, in comparison with the prior art film bulk acoustic wave resonator shown in FIGS. 2A and 2B. As an example, diameter of the prop was varied. Compared with the resonance Q of approximately 1000 for the prior art, the resonance Q of the first embodiment of the present invention with a 2 µm diameter prop was 1300 and the resonance Q of the first embodiment of the present invention with a 8 µm diameter prop was 1150, both being higher than 1000. However, if a prop with a diameter of 16 µm or larger, the resonance Q became lower than the resonance Q of the prior art. Based on these results, it is preferable to make the diameter of the prop smaller than 16 µm.

With reference to FIG. 4, the following now explains an example of how to fabricate the film bulk acoustic wave resonator of the first embodiment. First, a 900 nm deep gap 80 is formed in the insulating substrate made of high-resistance silicon by the conventional photoresist and etching processes. At this time, a part of the high-resistance silicon substrate is left out to function as the prop 50 at the center of the gap. In this way, the prop 50 and the gap 80 are formed at the same time. Next, $Si_3N_4$ is deposited up to a thickness of 100 nm on the gap 80 of the insulating substrate 1 and made into a barrier layer 82 by a film forming apparatus, and phosphosilicate glass (PSG) is additionally deposited thereon up to a thickness of 100 nm as a sacrificial layer 81.

Next, the sacrificial layer 81 is planarized by chemical mechanical polishing (CMP) to expose the surface of the barrier layer 82 that is formed on the insulating substrate 1. The sacrificial layer 81 is then filled in the gap 80, and AlN is deposited on the planar surface of the insulating substrate 1 up to a thickness of 30 nm as the support layer 2. Then, Mo is deposited up to a thickness of 400 nm as the first electrode layer 3 and patterned by the conventional photoresist and etching processes to obtain the first electrode layer 3 of a desired area. Next, AlN is deposited up to a thickness of 950 nm as the piezoelectric layer 4, followed by Mo with the thickness of 400 nm as the second electrode layer 5.

After that, the second electrode layer 5 made of Mo is patterned by the conventional photoresist and etching processes to obtain the second electrode layer 5 of a desired area. Then, the piezoelectric layer 4 made of AlN is patterned by the conventional photoresist and etching processes to obtain the piezoelectric layer 4 of a desired area. Next, to form the gap 80 in a lower area of the film bulk acoustic wave resonator, the sacrificial layer 81 made of PSG is removed with HF solution. With the fabrication method described above, the film bulk acoustic wave resonator of the first embodiment can be obtained.

The fabrication method described above enables to avoid contact areas between the laminate-structured resonance part 20 and the insulating substrate 1 as much as possible and to make the laminate-structured resonance part 20 supported on the hollow. The resulting configuration can suppress the leakage of bulk acoustic waves that are trapped inside the laminate-structured resonance part 20 towards the insulating substrate 1. Therefore, bulk acoustic waves can be more efficiently trapped inside the laminate-structured resonance part 20, and a high Q factor in the laminate-structured resonance part 20 can be achieved.

Since most of the laminate-structured resonance part 20 is supported on the hollow, it seems to be weak and is vulnerable to damage, but the prop 50 underneath the laminate-structured resonance part 20 gives a necessary strength to avoid such damage. Moreover, when the sacrificial layer is filled into the hollow (or a hole layer) formed in the insulating substrate 1 and is planarized by chemical mechanical polishing (CMP), the presence of the prop 50 serves to reduce dishing in the CMP.

Embodiment 2

Figure 5A:
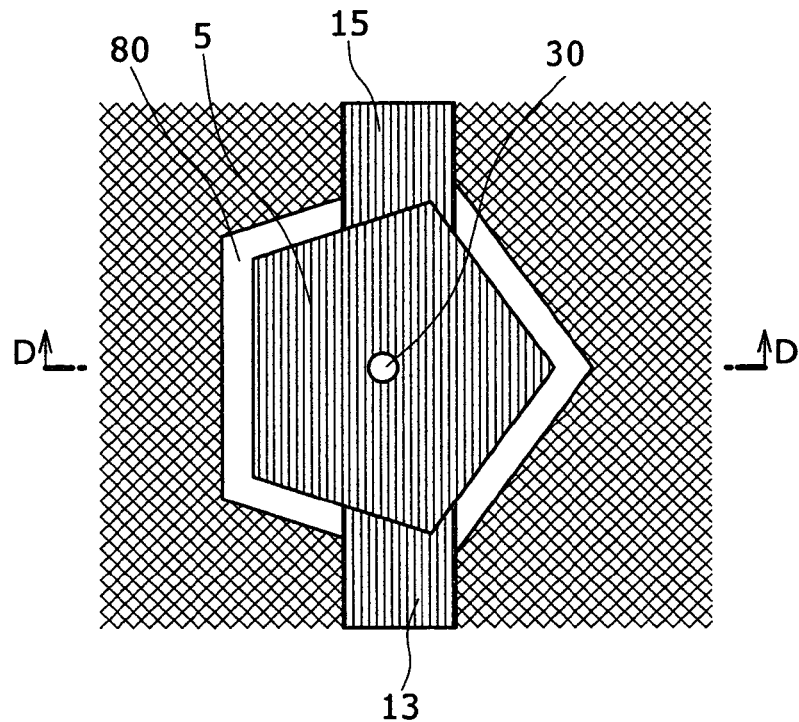
FIG. 5A is a plan view showing one example of a film bulk acoustic wave resonator as a second embodiment according to the present invention.
Figure 5B:
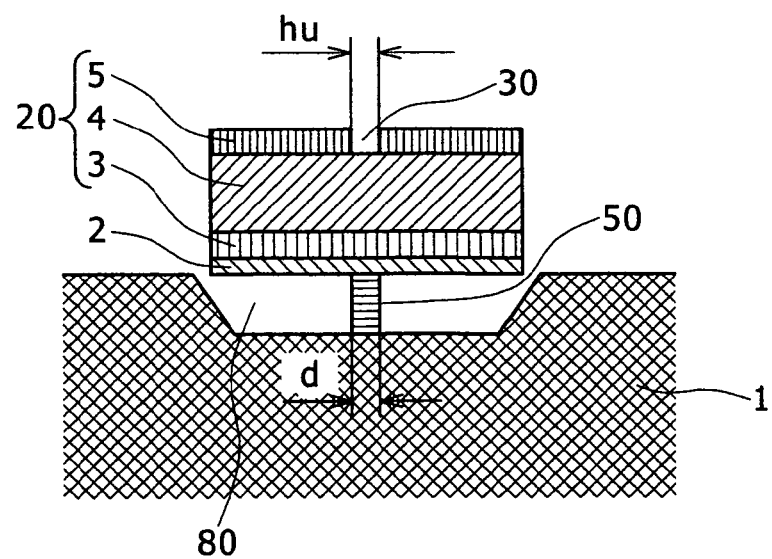
FIG. 5B is a cross-sectional view thereof.

FIG. 5A is a top schematic view of a film bulk acoustic wave resonator according to a second embodiment, and FIG. 5B is a cross-sectional schematic view of the film bulk acoustic wave resonator according to the first embodiment, which is taken along line D-D in FIG. 5A. Referring to FIGS. 5A and 5B, one example of the film bulk acoustic wave resonator according to the second embodiment of the present invention will be described. In the second embodiment, the film bulk acoustic wave resonator includes a laminate-structured resonance part 20 which is formed on an insulating substrate 1 and composed of a piezoelectric layer 4, a first electrode layer 3 serving as a lower electrode, and a second electrode layer 5 serving as an upper electrode, the first and second electrode layers interposing at least part of the piezoelectric layer 4 between them. The first metal electrode 3 is dispersively formed on an electrode plane facing the second metal electrode 5, and a gap 80 is formed in the insulating substrate 1 in an area correspondingly to the laminate-structured resonance part 20. Except for an area of a wire electrode 13 electrically connected to the first electrode layer 3 and an area of a wire electrode 15 electrically connected to the second electrode layer 5, the laminate-structured resonance part 20 does not come in contact with the insulating substrate 1 but is supported on a hollow, and a prop 50 is arranged in the gap 80. Meanwhile, a portion out of the second electrode layer 5 serving as the upper electrode, the portion corresponding to the prop 50 formed on the insulating substrate 1, is void. In the second embodiment, the insulating substrate 1 made of high-resistance silicon has the gap 80, and the prop 50 with 2 μm diameter is formed at the center of the gap 80. In this embodiment, the prop 50 is formed by leaving out a portion of the high-resistance silicon substrate at the time of forming the gap 80 in the high-resistance silicon substrate.

In a more specific example, the laminate-structured resonance part 20 is composed of 30 nm AlN is disposed as a support layer 2, 400 nm Mo as the first electrode layer 3, 950 nm AlN as the piezoelectric layer 4, and 400 nm Mo as the second electrode layer, and the prop 5 is arranged at the center of the laminate-structured resonance part 20. Also, as noted earlier, a portion out of the second electrode layer 5 serving as the upper electrode, the portion corresponding to the prop 50 formed on the insulating substrate 1, is void.

The wire electrode 13 which is electrically connected to the first electrode layer 3, together constituting the lower electrode, and the wire electrode 15 which is electrically connected to the second electrode layer 5, together constituting the upper electrode are connected to the laminate-structured resonance part 20 in width of 40 μm. In this embodiment, the wire electrodes 13 and 15 are the only areas where the laminate-structured resonance part 20 contacts the insulating substrate 1, such that, in the other areas, the laminate-structured resonance part 20 does not come in contact with the insulating substrate 1 but is supported on the hollow.

Based on the above configuration, the film bulk acoustic wave resonator suggested in the second embodiment of the present invention has an advantage of eliminating the influence of the prop 50, which is accomplished by emptying an area of the second electrode layer 5 serving as the upper electrode, the area corresponding to the prop 50 formed on the insulating substrate 1, so that the area coming in contact with the prop 50 would not function as a resonator. In this case, the diameter hu of a hole 30 formed in the second electrode layer 5 and the diameter d of the prop 50 formed in the insulating substrate 1 must satisfy a condition of hu>d.

Moreover, contact areas between the laminate-structured resonance part 20 and the insulating substrate 1 are avoided as much as possible and the laminate-structured resonance part 20 is supported on the hollow. This configuration can suppress the leakage of bulk acoustic waves that are trapped inside the laminate-structured resonance part 20 towards the insulating substrate 1. Therefore, bulk acoustic waves can be more efficiently trapped inside the laminate-structured resonance part 20, and a high Q factor in the laminate-structured resonance part 20 can be achieved.

Since most of the laminate-structured resonance part 20 is supported on the hollow, it seems to be weak and is vulnerable to damage, but the prop 50 underneath the laminate-structured resonance part 20 gives a necessary strength to avoid such damage. In addition, when the sacrificial layer is filled into the hollow (or a hole layer) formed in the insulating substrate 1 and is planarized by chemical mechanical polishing (CMP), the presence of the prop 50 serves to reduce dishing in the CMP.

Figure 6A:
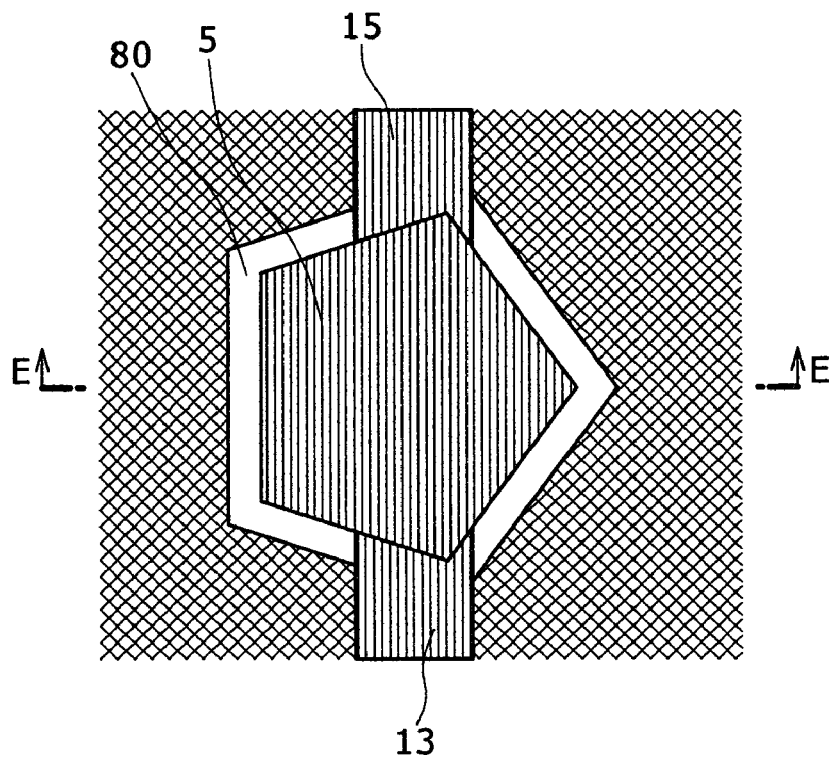
FIG. 6A is a plan view showing another example of a film bulk acoustic wave resonator as the second embodiment according to the present invention.
Figure 6B:
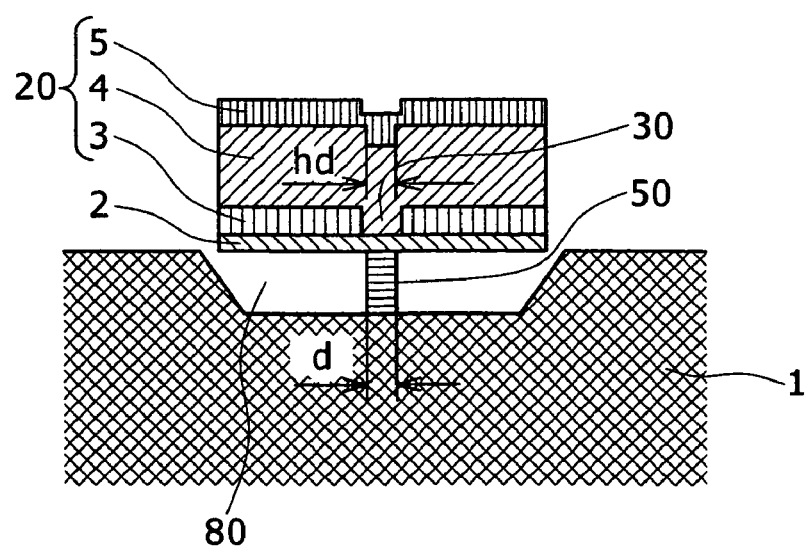
FIG. 6B is a cross-sectional view thereof.

FIG. 6A is another top schematic view of a film bulk acoustic wave resonator according to the second embodiment, and FIG. 6B is a cross-sectional schematic view of the film bulk acoustic wave resonator according to the second embodiment, which is taken along line E-E in FIG. 6A. FIGS. 6A and 6B illustrate a configuration where a portion out of the first electrode layer 3 corresponding to the prop 50 that is formed on the insulating substrate 1 is void. With this configuration, similar to the second embodiment in FIGS. 5A and 5B, the area coming in contact with the prop 50 does not act as a resonator, and the influence of the prop 50 can be eliminated.

However, if there is a hole 30 in the first electrode layer 3, a step difference is created even in the piezoelectric layer 4 that is laminated on the first electrode layer 3, which adversely affects a C-axis orientation of the piezoelectric layer 4 around the hole 30, thereby impairing the performance of the resonator.

Figure 7A:
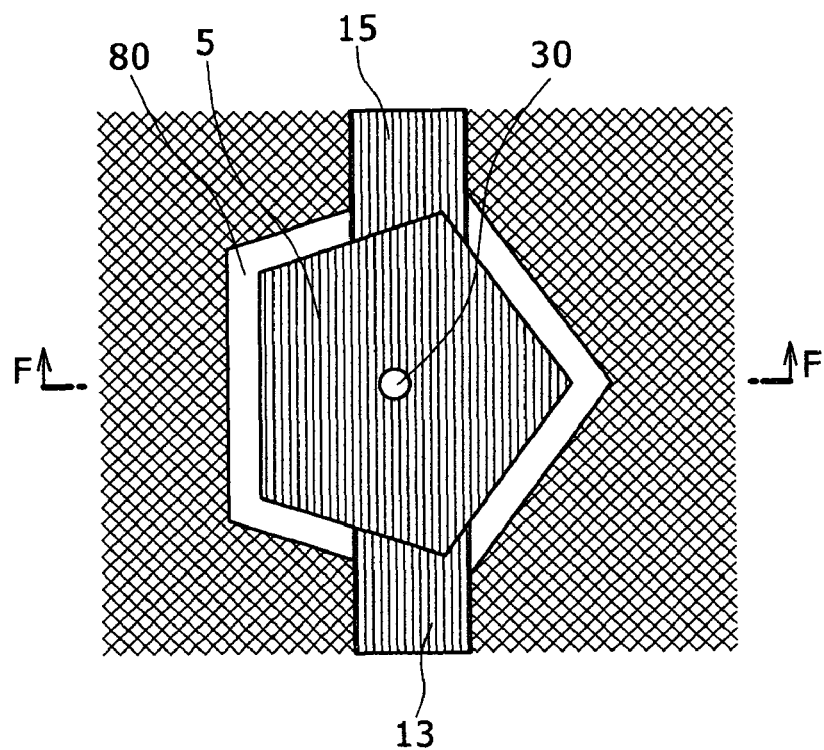
FIG. 7A is a plan view showing still another example of a film bulk acoustic wave resonator as the second embodiment according to the present invention.
Figure 7B:
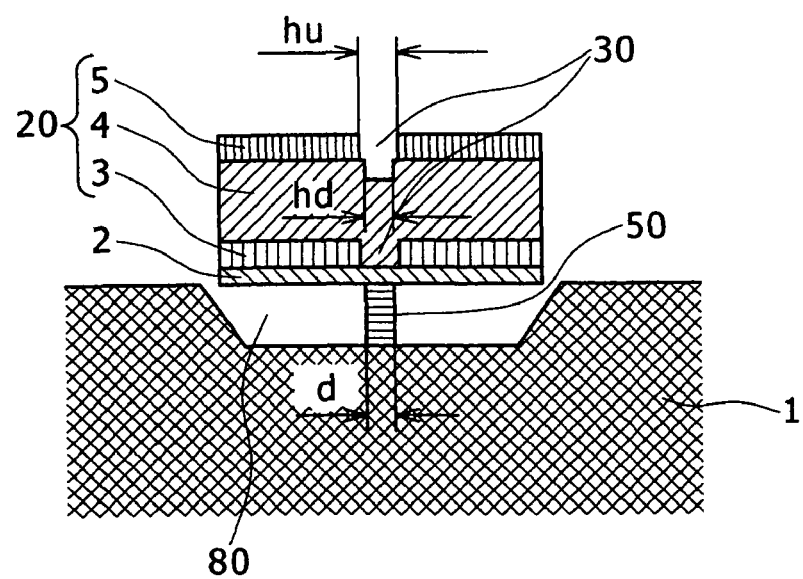
FIG. 7B is a cross-sectional view thereof.

FIG. 7A is still another top schematic view of a film bulk acoustic wave resonator according to the second embodiment, and FIG. 7B is a cross-sectional schematic view of the film bulk acoustic wave resonator according to the second embodiment, which is taken along line F-F in FIG. 7A. FIGS. 7A and 7B illustrate a configuration where a portion out of the first electrode layer and a portion out of the second electrode layer, both portions corresponding to the prop 50 formed on the insulating substrate 1, are void. Again in this configuration, the portion of the first electrode layer 3 serving as the lower electrode and the portion of the second electrode layer 5 serving as the upper electrode, which are corresponding to the prop 50 formed on the insulating substrate are empty, such that the area coming in contact with the prop 50 does not act as a resonator, and the influence of the prop 50 can be eliminated. In this case, the adverse effect on the C-axis orientation of the piezoelectric layer 4 due to the presence of the hole 30 in the first electrode layer 3 can be suppressed by forming the same hole 30 in the second electrode layer 5 also, thereby avoiding impairment of the resonator performance. Here, the diameter hu of the hole 30 formed in the second electrode layer 5, the diameter hd of the hole 30 formed in the first electrode layer 3, and the diameter d of the prop 50 formed in the insulating substrate 1 must satisfy a condition of hu>hd>d. As such, the influence of the prop 50 is eliminated and it becomes possible to avoid the adverse effect on the C-axis orientation of the piezoelectric layer 4 due to the influence of the step difference.

Embodiment 3

Figure 8A:
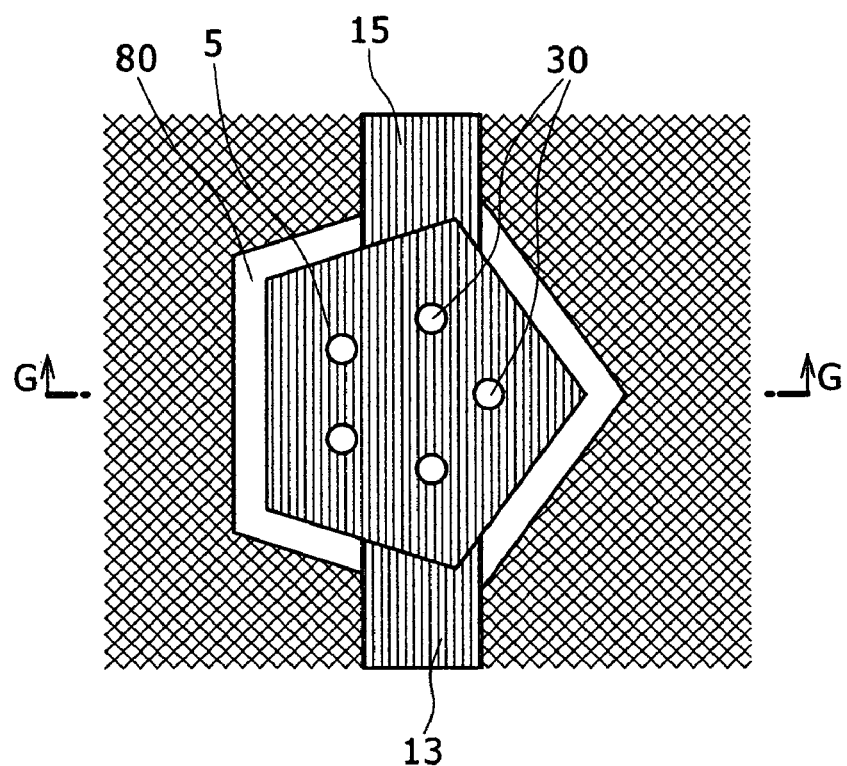
FIG. 8A is a plan view showing one example of a film bulk acoustic wave resonator as a third embodiment according to the present invention.
Figure 8B:
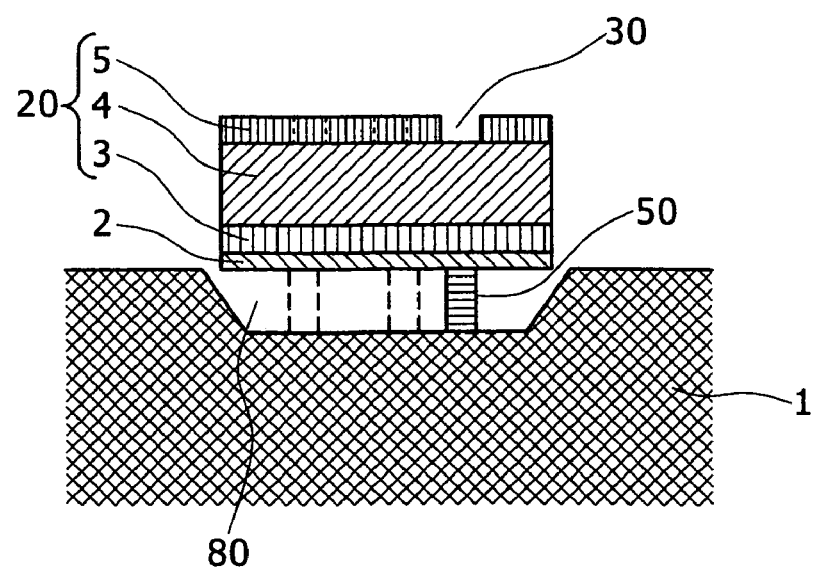
FIG. 8B is a cross-sectional view thereof.

FIG. 8A is a top schematic view of a film bulk acoustic wave resonator according to a third embodiment, and FIG. 8B is a cross-sectional schematic view of the film bulk acoustic wave resonator according to the third embodiment, which is taken along line G-G in FIG. 8A. Referring to FIGS. 8A and 8B, one example of the film bulk acoustic wave resonator according to the third embodiment of the present invention will be described. In the third embodiment, the film bulk acoustic wave resonator includes a laminate-structured resonance part 20 which is formed on an insulating substrate 1 and composed of a piezoelectric layer 4, a first electrode layer 3 serving as a lower electrode, and a second electrode layer 5 serving as an upper electrode, the first and second electrode layers interposing at least part of the piezoelectric layer 4 between them. The first metal electrode 3 is dispersively formed on an electrode plane facing the second metal electrode 5, and a gap 80 is formed in the insulating substrate 1 in an area correspondingly to the laminate-structured resonance part 20. Except for an area of a wire electrode 13 electrically connected to the first electrode layer 3 and an area of a wire electrode 15 electrically connected to the second electrode layer 5, the laminate-structured resonance part 20 does not come in contact with the insulating substrate 1 but is supported on a hollow, and a prop 50 is arranged in the gap 80. Meanwhile, a portion out of the second electrode layer 5 serving as the upper electrode, the portion corresponding to the prop 50 formed on the insulating substrate 1, is void.

In the third embodiment, 4 μm-diameter props are arranged at regular intervals in an area 35 μm away from the center of the gap 80 formed in the insulating substrate 1 made of high-resistance silicon. In this embodiment, the prop 50 is formed by leaving out a portion of the high-resistance silicon substrate at the time of forming the gap 80 in the high-resistance silicon substrate. In detail, the laminate-structured resonance part 20 is composed of 30 nm AlN is disposed as a support layer 2, 400 nm Mo as the first electrode layer 3, 950 nm AlN as the piezoelectric layer 4, and 400 nm Mo as the second electrode layer 5, and five props 5 are arranged at regular intervals from the center of the laminate-structured resonance part 20. Also, a portion out of the second electrode layer 5 serving as the upper electrode, the portion corresponding to the prop 50 formed on the insulating substrate 1, is void.

The wire electrode 13 which is electrically connected to the first electrode layer 3, together constituting the lower electrode, and the wire electrode 15 which is electrically connected to the second electrode layer 5, together constituting the upper electrode are connected to the laminate-structured resonance part 20 in width of 60 μm. In the this embodiment, the wire electrodes 13 and 15 are the only areas where the laminate-structured resonance part 20 contacts the insulating substrate 1, such that, in the other areas, the laminate-structured resonance part 20 does not come in contact with the insulating substrate 1 but is supported on the hollow.

Figure 9:
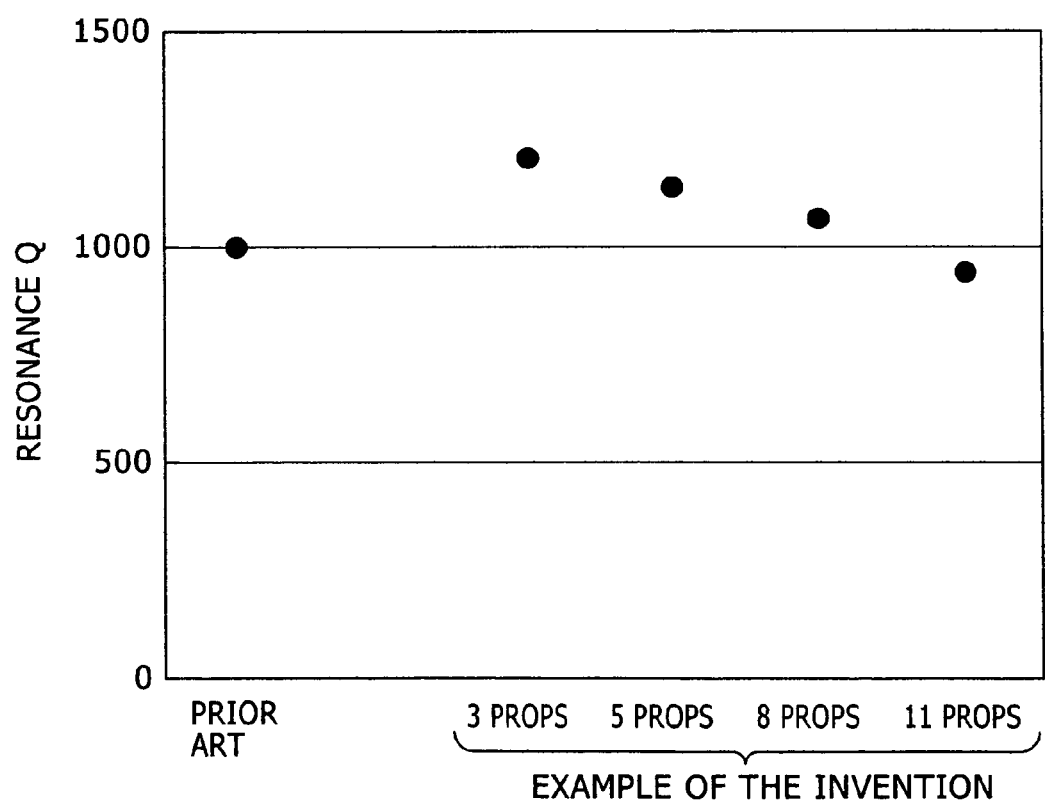
FIG. 9 shows quality factor at resonant frequency of the film bulk acoustic wave resonator of the third embodiment according to the present invention.

FIG. 9 shows quality factor (resonance Q) at resonance frequency of the film bulk acoustic wave resonator according to the third embodiment of the present invention in FIG. 8, in comparison with the prior art film bulk acoustic wave resonator shown in FIG. 2. As an example, number of props was varied. Compared with the resonance Q of approximately 1000 for the prior art, the resonance Q of the third embodiment of the present invention with three props 50 was 1200, the resonance Q of the third embodiment of the present invention with five props was 1120, and the resonance Q of the first embodiment of the present invention with eight props was 1080, each being higher than 1000. However, if eleven props are present, the resonance Q became 950 which is lower than the resonance Q of the prior art. Based on these results, it is preferable to keep the number of props 11 or lower. With the above configuration, the film bulk acoustic wave resonator suggested in the third embodiment of the present invention has an advantage of eliminating the influence of the prop 50, which is accomplished by emptying an area of the second electrode layer 5 serving as the upper electrode, the area corresponding to the prop 50 formed on the insulating substrate 1, so that the area coming in contact with the prop 50 would not function as a resonator.

Moreover, in the configuration of the film bulk acoustic wave resonator shown in FIG. 3, contact areas between the laminate-structured resonance part 20 and the insulating substrate 1 are avoided as much as possible and the laminate-structured resonance part 20 is supported on the hollow. This configuration can suppress the leakage of bulk acoustic waves that are trapped inside the laminate-structured resonance part 20 towards the insulating substrate 1. Therefore, bulk acoustic waves can be more efficiently trapped inside the laminate-structured resonance part 20, and a high Q factor in the laminate-structured resonance part 20 can be achieved. Since most of the laminate-structured resonance part 20 is supported on the hollow, it seems to be weak and is vulnerable to damage, but the prop 50 underneath the laminate-structured resonance part 20 gives a necessary strength to avoid such damage.

In addition, when the sacrificial layer is filled into the hollow (or a hole layer) formed in the insulating substrate 1 and is planarized by chemical mechanical polishing (CMP), the presence of the props 50 serves to reduce dishing in the CMP.

Embodiment 4

Figure 10A:
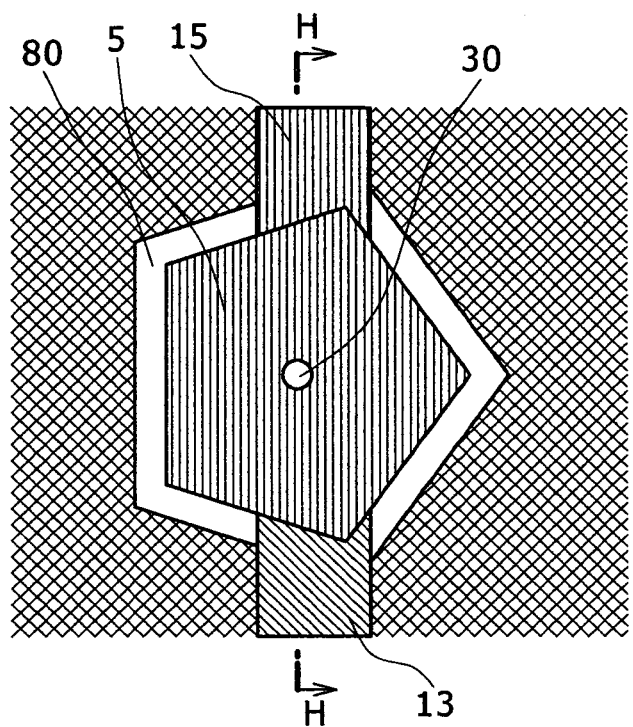
FIG. 10A is a plan view showing one example of a film bulk acoustic wave resonator as a fourth embodiment according to the present invention.
Figure 10B:
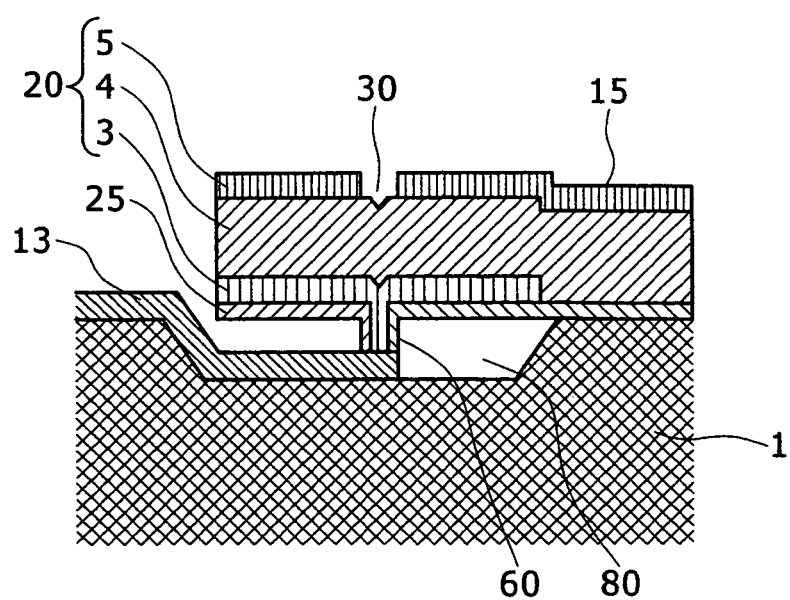
FIG. 10B is a cross-sectional view thereof.
Figure 11A:
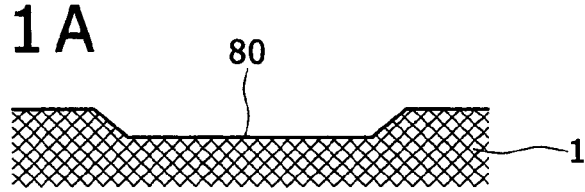
FIGS. 11A to 11G are cross-sectional configurational views to sequentially explain an example of the fabrication method of the film bulk acoustic wave resonator as the fourth embodiment of the present invention.
Figure 11B:
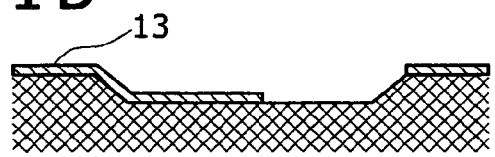
Figure 11C:
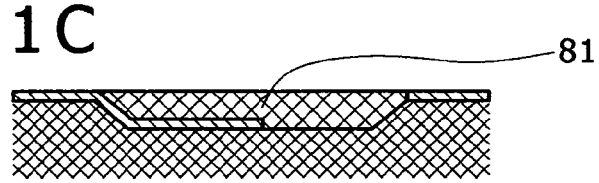
Figure 11D:
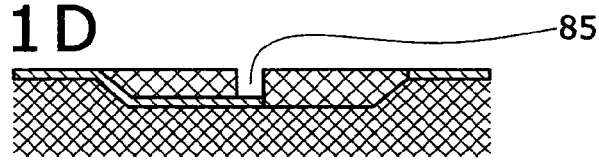
Figure 11E:
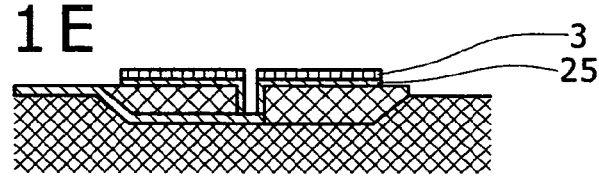
Figure 11F:
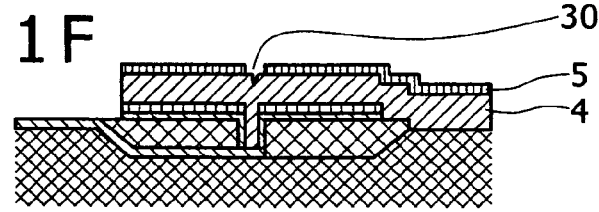
Figure 11G:
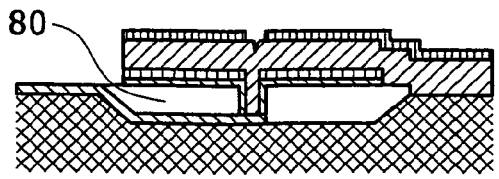

FIG. 10A is a top schematic view of a film bulk acoustic wave resonator according to a fourth embodiment, and FIG. 10B is a cross-sectional schematic view of the film bulk acoustic wave resonator according to the fourth embodiment, which is taken along line H-H in FIG. 10A. Referring to FIGS. 10A and 10B, one example of the film bulk acoustic wave resonator according to the fourth embodiment of the present invention will be described. In the fourth embodiment, the film bulk acoustic wave resonator includes a laminate-structured resonance part 20 which is formed on an insulating substrate 1 and composed of a piezoelectric layer 4, a first electrode layer 3 serving as a lower electrode, and a second electrode layer 5 serving as an upper electrode, the first and second electrode layers interposing at least part of the piezoelectric layer 4 between them. The first metal electrode 3 is dispersively formed on an electrode plane facing the second metal electrode 5, and a gap 80 is formed in the insulating substrate 1 in an area correspondingly to the laminate-structured resonance part 20. As a wire electrode 13 is electrically connected to the first electrode layer 3 via a conducting prop 60 being interposed between them, an area of a wire electrode 15 which is electrically connected to the second electrode layer 5 is the only place where the laminate-structured resonance part 20 contacts the insulating substrate 1. In the other areas, however, the laminate-structured resonance part 20 is supported on a hollow. Further, a portion out of the second electrode layer 5 serving as the upper electrode, the portion corresponding to the conducting prop 60 formed on the insulating substrate 1, is void.

In the fourth embodiment, the insulating substrate 1 made of high-resistance silicon has the gap 80, and the conducting prop 60 with 6 μm diameter is formed at the center of the gap 80. In this embodiment, to form the conducting prop 60, the gap 80 is first formed in the high-resistance silicon substrate 1, and the wire electrode 13 of any shape being electrically connected to the first electrode layer 3 which serves as the lower electrode is then formed in the gap 80. Lastly, a portion of the sacrificial layer 80 is removed to form the prop, such that the conducting prop 60 is formed by a conducting support layer 25 and the first electrode layer 3 serving as the lower electrode. This method is the most inexpensive method, but, needless to say, a separate process can always be added to form the conducting prop 60.

In a more specific example, the laminate-structured resonance part 20 is composed of 30 nm AlN is disposed as a support layer 25, 400 nm Mo as the first electrode layer 3, 950 nm AlN as the piezoelectric layer 4, and 400 nm Mo as the second electrode layer 5, and the conducting prop 60 is arranged at the center of the laminate-structured resonance part 20, and the wire electrode 13 is electrically connected to the first electrode layer 3 via the conducting prop 60 being interposed between them. Therefore, only the wire electrode 15 which is electrically connected to the second electrode layer 5 is connected to the laminate-structured resonance part 20 in width of 40 μm. In this embodiment, besides the conducting prop 60, the wire electrode 15 is the only area where the laminate-structured resonance part 20 contacts the insulating substrate 1, such that, in the other areas, the laminate-structured resonance part 20 does not come in contact with the insulating substrate 1 but is supported on the hollow.

With reference to FIGS. 11A to 11G, the following now explains an example of how to fabricate the film bulk acoustic wave resonator of the fourth embodiment. First, a 900 nm deep gap 80 is formed in the insulating substrate made of high-resistance silicon by the conventional photoresist and etching processes. Next, as the wire electrode 13 that is electrically connected to the first electrode layer, Mo is deposited up to a thickness of 400 nm on the insulating substrate including the gap, and Mo is then patterned by the conventional photoresist and etching processes to obtain the wire electrode 13. After that, by the film forming apparatus, phosphosilicate glass (PSG) is additionally deposited on the plane of the insulating substrate 1 with the gap 80 up to a thickness of 1000 nm as a sacrificial layer 81.

Next, the PSG of the sacrificial layer 81 is planarized by chemical mechanical polishing (CMP), and the sacrificial layer 81 is then filled in the gap 80. The sacrificial layer 81 in an area 85 where the prop needs be formed is removed by etching. After that, Ti is deposited up to a thickness of 30 nm as the conducting support layer 25, followed by Mo up to a thickness of 400 nm as the first electrode layer 3. Here, the conducting prop 60 is formed by filling the area 85 in the sacrificial layer where the prop needs to be formed with the conducting support layer 25 made of Ti and with the first electrode layer 3 made of Mo. Then, the first electrode layer 3 made of Mo is patterned by the conventional photoresist and etching processes to obtain the first electrode layer 3 of a desired area. Next, AlN is deposited up to a thickness of 950 nm as the piezoelectric layer 4, followed by Mo with the thickness of 400 nm as the second electrode layer 5.

After that, the second electrode layer 5 made of Mo is patterned by the conventional photoresist and etching processes to obtain the second electrode layer 5 of a desired area. Then, the piezoelectric layer 4 made of AlN is patterned by the conventional photoresist and etching processes to obtain the piezoelectric layer 4 of a desired area. Next, to form the gap 80 in a lower area of the film bulk acoustic wave resonator, the sacrificial layer 81 made of PSG is removed with HF solution. With the fabrication method described above, the film bulk acoustic wave resonator of the fourth embodiment can be obtained.

With the above configuration of the film bulk acoustic wave resonator suggested in the fourth embodiment of the present invention, contact areas between the laminate-structured resonance part 20 and the insulating substrate 1 are avoided as much as possible and the laminate-structured resonance part 20 is supported on the hollow. This configuration can suppress the leakage of bulk acoustic waves that are trapped inside the laminate-structured resonance part 20 towards the insulating substrate 1. Therefore, bulk acoustic waves can be more efficiently trapped inside the laminate-structured resonance part 20, and a high Q factor in the laminate-structured resonance part 20 can be achieved.

Moreover, the configuration of the film bulk acoustic wave resonator suggested in the fourth embodiment of the present invention has an advantage of eliminating the influence of the conducting prop 60, which is accomplished by emptying an area of the second electrode layer 5 serving as the upper electrode, the area corresponding to the conducting prop 60 formed on the insulating substrate 1, so that the area coming in contact with the conducting prop 60 would not function as a resonator.

Since most of the laminate-structured resonance part 20 is supported on the hollow, it seems to be weak and is vulnerable to damage, but the conducting prop 60 underneath the laminate-structured resonance part 20 gives a necessary strength to avoid such damage.

Embodiment 5

Figure 12A:
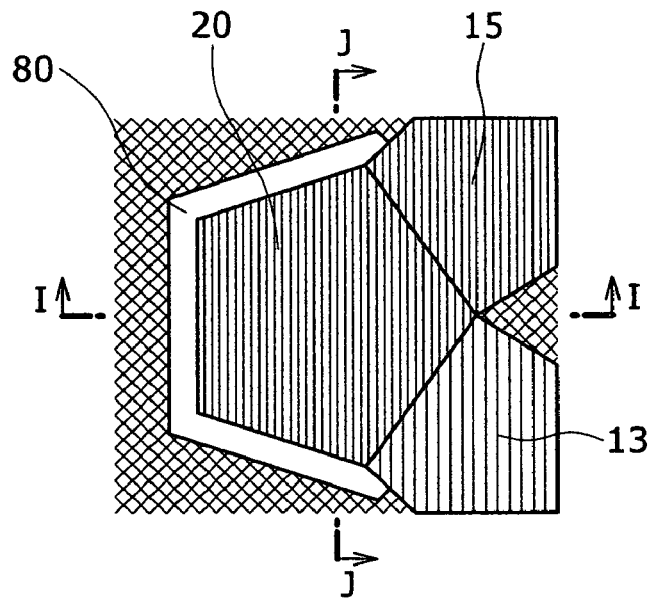
FIG. 12A is a plan view showing one example of a film bulk acoustic wave resonator as a first embodiment according to the present invention.
Figure 12B:
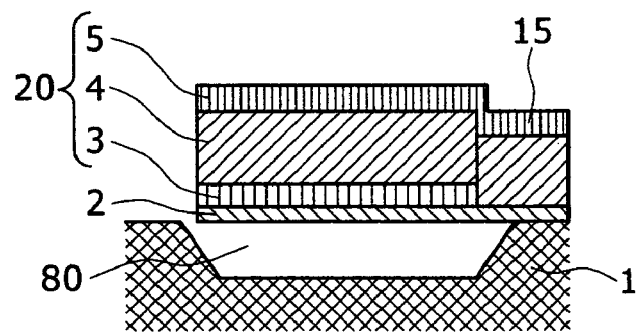
FIGS. 12B and 12C are cross-sectional views thereof.
Figure 12C:
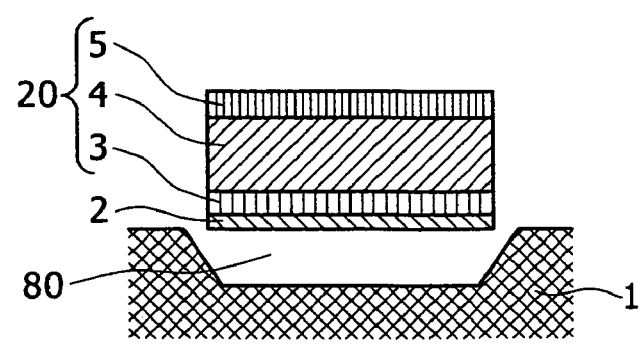

FIG. 12A is a top schematic view of a film bulk acoustic wave resonator according to a fifth embodiment, and FIGS. 12B and 12C each show a cross-sectional schematic view of the film bulk acoustic wave resonator according to the fifth embodiment. In detail, the FIG. 12B is a sectional view taken along line I-I in FIG. 12A, and FIG. 12C is a sectional view taken along line J-J in FIG. 12A. An FBAR-type film bulk acoustic wave resonator is formed on an insulating substrate 1. A laminate-structured resonance part 20 of this FBAR-type film bulk acoustic wave resonator has a laminate structure including a piezoelectric layer 4, and a pair of electrode layers (a first electrode layer 3 and a second electrode layer 5) interposing at least part of the piezoelectric layer 4 between them.

Referring to FIGS. 12A to 12C, one example of the film bulk acoustic wave resonator according to the fifth embodiment of the present invention will be described. In the fifth embodiment, the film bulk acoustic wave resonator includes a laminate-structured resonance part 20 which is formed on an insulating substrate 1 and composed of a piezoelectric layer 4, a first electrode layer 3 serving as a lower electrode, and a second electrode layer 5 serving as an upper electrode, the first and second electrode layers interposing at least part of the piezoelectric layer 4 between them. The first metal electrode 3 is dispersively formed on an electrode plane facing the second metal electrode 5. Except for an area where a wire electrode 13 is electrically connected to the first electrode layer 3 and an area where a wire electrode 15 is electrically connected to the second electrode layer 5, the piezoelectric layer 4, and the first and second electrode layers 3 and 5 do not contact the insulating substrate but are supported on a hollow. In particular, the wire electrode 13 electrically connected to the first electrode layer 3 and the wire electrode 15 electrically connected to the second electrode layer 5 are connected leaning towards one side with respect to the central line of the laminate-structured resonance part 20.

In the fifth embodiment, a gap 80 is formed in the insulating substrate 1 made of high-resistance silicon. The laminate-structured resonance part 20 is composed of 30 nm AlN disposed as a support layer 2, 400 nm Mo as the first electrode layer 3, 950 nm AlN as the piezoelectric layer 4, and 400 nm Mo as the second electrode layer 5, and with the respect to the central line J-J, the wire electrode 13 serving as a lower electrode electrically connected to the first electrode layer 3 serving as a lower electrode and the wire electrode 15 serving as an upper electrode electrically connected to the second electrode layer 5 serving as an upper electrode are connected leaning toward one side with respect to the central line of the laminate-structured resonance part 20 in width of 50 μm. In this embodiment, besides the conducting prop 20, the wire electrode 15 is the only area where the laminate-structured resonance part 20 contacts the insulating substrate 1, such that, in the other areas, the laminate-structured resonance part 20 does not come in contact with the insulating substrate 1 but is supported on the hollow.

With the above-described configuration of the film bulk acoustic wave resonator suggested in the fifth embodiment, contact areas between the laminate-structured resonance part 20 and the insulating substrate 1 are avoided as much as possible and the laminate-structured resonance part 20 is supported on the hollow. Further, the wired electrodes 13 and 15 being electrically connected to the first and second electrode layers 3 and 5, respectively, are connected leaning towards the central line of the laminate-structured resonance part, and therefore the laminate-structured resonance part 20 has a cantilever structure and can avoid film tension and damages on the resonator. With the above configuration, the leakage of bulk acoustic waves, which have been trapped in the laminate-structured resonance part 20, towards the insulation substrate can be suppressed. Moreover, it becomes possible to efficiently trap bulk acoustic waves inside the resonator and achieve the laminate-structured resonance part 20 with a high Q factor.

Embodiment 6

Figure 13A:
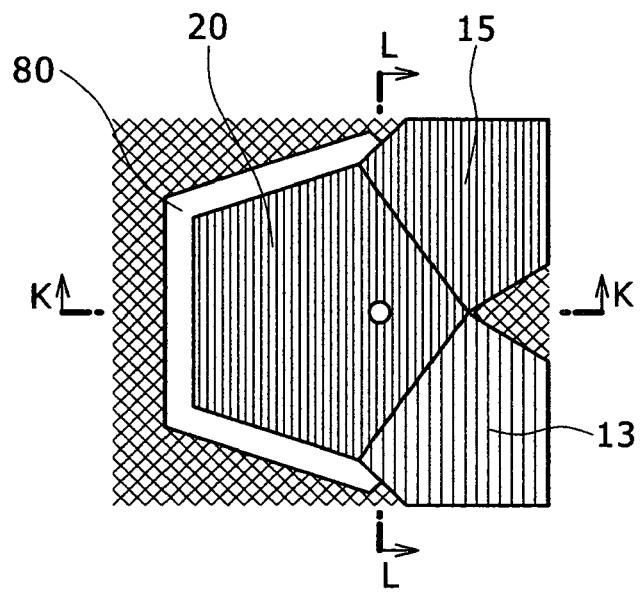
FIG. 13A is a plan view showing one example of a film bulk acoustic wave resonator as a first embodiment according to the present invention.
Figure 13B:
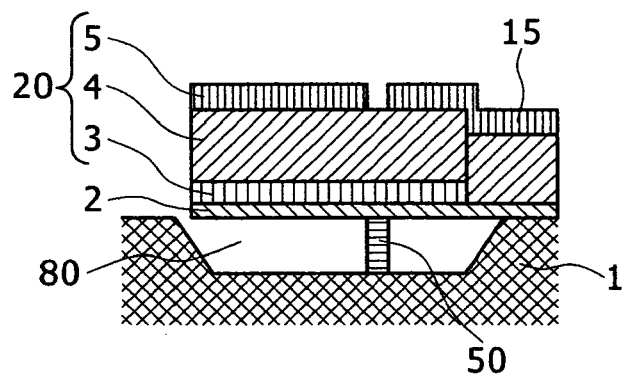
FIGS. 13B and 13C are cross-sectional views thereof.
Figure 13C:
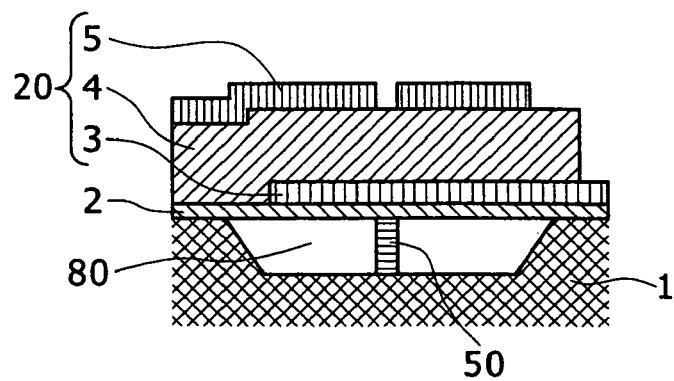

FIG. 13A is a top schematic view of a film bulk acoustic wave resonator according to a sixth embodiment, and FIGS. 13B and 13C each show a cross-sectional schematic view of the film bulk acoustic wave resonator according to the sixth embodiment. In detail, the FIG. 13B is a sectional view taken along line K-K in FIG. 13A, and FIG. 13C is a sectional view taken along line L-L in FIG. 13A. An FBAR-type film bulk acoustic wave resonator is formed on an insulating substrate 1. A laminate-structured resonance part 20 of this FBAR-type film bulk acoustic wave resonator has a laminate structure including a piezoelectric layer 4, and a pair of electrode layers (a first electrode layer 3 and a second electrode layer 5) interposing at least part of the piezoelectric layer 4 between them.

Referring to FIGS. 13A to 13C, one example of the film bulk acoustic wave resonator according to the sixth embodiment of the present invention will be described. In the sixth embodiment, the film bulk acoustic wave resonator includes a laminate-structured resonance part 20 which is formed on an insulating substrate 1 and composed of a piezoelectric layer 4, a first electrode layer 3 serving as a lower electrode, and a second electrode layer 5 serving as an upper electrode, the first and second electrode layers interposing at least part of the piezoelectric layer 4 between them. The first metal electrode 3 is dispersively formed on an electrode plane facing the second metal electrode 5. Except for an area where a wire electrode 13 is electrically connected to the first electrode layer 3 and an area where a wire electrode 15 is electrically connected to the second electrode layer 5, the piezoelectric layer 4, and the first and second electrode layers 3 and 5 do not contact the insulating substrate but are supported on a hollow. In particular, the wire electrode 13 electrically connected to the first electrode layer 3 and the wire electrode 15 electrically connected to the second electrode layer 5 are connected leaning towards one side with respect to the central line of the laminate-structured resonance part 20. Also, a prop 50 is arranged in the gap 80, and a portion out of the second electrode layer 5 serving as the upper electrode, the portion corresponding to the prop 50 formed on the insulating substrate 1, is void.

In the sixth embodiment, the prop 50 with 4 μm diameter is formed on the K-K line that is leaned towards the connection side by the wire electrodes 13 and 15, with respect to the central line of the gap 80 formed in the insulating substrate 1 made of high-resistance silicon. In this embodiment, the prop 50 is formed by leaving out a portion of the high-resistance silicon substrate corresponding to the prop 50 at the time of forming the gap 80 in the high-resistance silicon substrate. This method does not require a separate process for forming the prop 50 and is the most inexpensive method, but, needless to say, a separate process can always be added therefor. It is also needless to say that the prop 50 may be made of other insulating materials or conducting materials, besides the insulating substrate 1.

In a more specific example, the laminate-structured resonance part 20 is composed of 30 nm AlN is disposed as a support layer 2, 400 nm Mo as the first electrode layer 3, 950 nm AlN as the piezoelectric layer 4, and 400 nm Mo as the second electrode layer 5, and the prop 5 is arranged at the center of the laminate-structured resonance part 20. The wire electrode 13 which is electrically connected to the first electrode layer 3, together constituting the lower electrode, and the wire electrode 15 which is electrically connected to the second electrode layer 5, together constituting the upper electrode are connected to the laminate-structured resonance part 20 in width of 40 μm. In the sixth embodiment, the wire electrodes 13 and 15 are the only areas, besides the prop 50, where the laminate-structured resonance part 20 contacts the insulating substrate 1, such that, in the other areas, the laminate-structured resonance part 20 does not come in contact with the insulating substrate 1 but is supported on the hollow.

With the above-described configuration of the film bulk acoustic wave resonator suggested in the sixth embodiment, contact areas between the laminate-structured resonance part 20 and the insulating substrate 1 are avoided as much as possible and the laminate-structured resonance part 20 is supported on the hollow. This figuration can suppress the leakage of bulk acoustic waves that are trapped inside the laminate-structured resonance part 20 towards the insulating substrate 1. Therefore, bulk acoustic waves can be more efficiently trapped inside the laminate-structured resonance part 20, and a high Q factor in the laminate-structured resonance part 20 can be achieved.

Further, a portion of the second electrode layer 5 serving as the upper electrode, the portion corresponding to the prop 50 formed on the insulating substrate is empty, such that the area coming in contact with the prop 50 does not act as a resonator, and the influence of the prop 50 can be eliminated.

Since most of the laminate-structured resonance part 20 is supported on the hollow, it seems to be weak and is vulnerable to damage, but the structure where the prop 50 underneath the laminate-structured resonance part 20 and the wired electrodes 13 and 15 being electrically connected to the first and second electrode layers 3 and 5, respectively, are connected leaning towards the central line of the laminate-structured resonance part, the laminate-structured resonance part 20 has a cantilever structure and can avoid film tension and damages on the resonator.

Further, when the sacrificial layer is filled into the hollow (or a hole layer) formed in the insulating substrate 1 and is planarized by chemical mechanical polishing (CMP), the presence of the prop serves to reduce dishing in the CMP.

Embodiment 7

As a seventh embodiment, an example of how to configure a film bulk acoustic wave resonator filter using a film bulk acoustic wave resonator on a single substrate is now explained.

Figure 14:
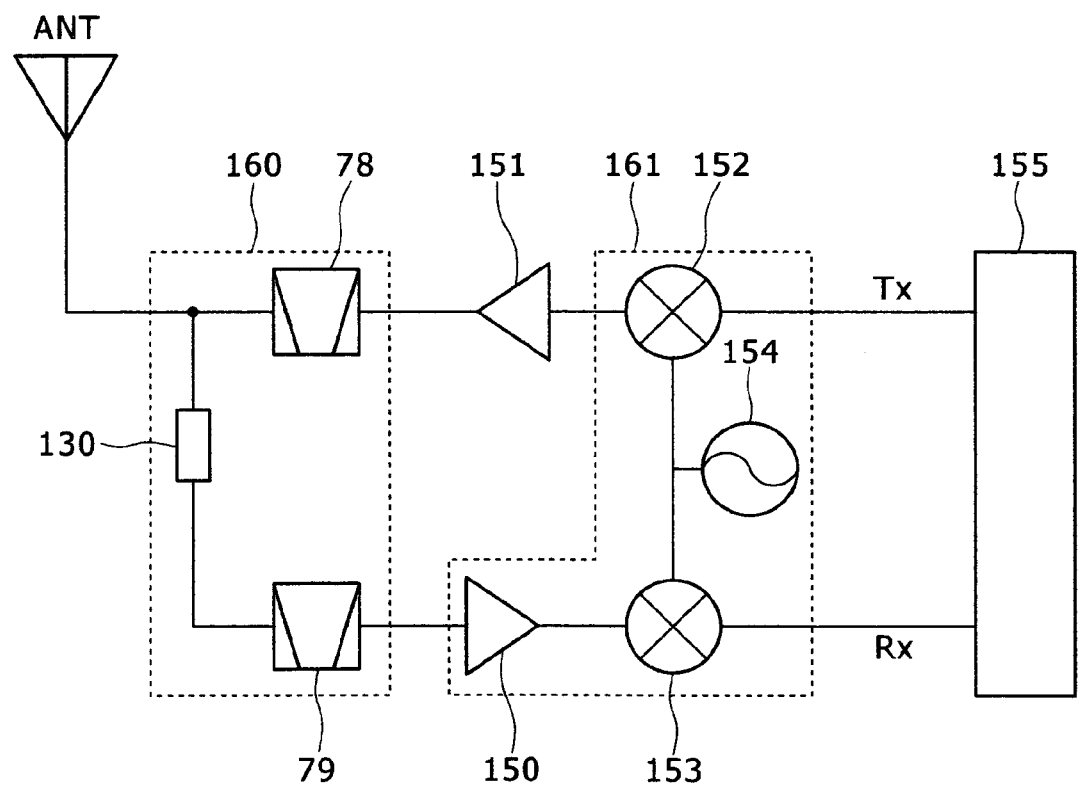
FIG. 14 is a circuit block diagram of a front end portion in a conventional mobile phone.

FIG. 14 illustrates one example of a block circuit diagram used for a mobile phone in general. In FIG. 14, a radio frequency signal received by an antenna ANT passes through a phase shifter 130, followed by a receiver filter 79 which removes an image frequency signal from the radio frequency signal to filter only a predetermined receiving frequency band signal. The filtered radio frequency receive signal Rx is then inputted to a low noise amplifier 159 and amplified therein. Next, the amplified radio frequency receive signal Rx goes through base band conversion in a receiving mixer 153 and is sent to a base band 155.

Meanwhile, a radio frequency transmit signal Tx transmitted from the base band 155 goes to a transmission mixer 152 where the signal Tx is modulated. Next, the modulated radio frequency signal Tx is inputted to a power amplifier module 151 where it is amplified. The amplified radio frequency transmit signal Tx amplified by the power amplifier module 151 is then filtered by a transmitter filter 78 that passes only a predetermined frequency band transmit signal and radiated as an electric wave via the antenna. A conventional portable phone includes a phase shifter 130 that enables a common use of a receiving part and a transmitting part, a synthesizer 154, and a base band 155 that processes transmitting/received signals.

Here, the radio frequency signal transmitter filter 78 and receiver filter 79, each being used as a front end portion, can be composed of a set of plural film bulk acoustic wave resonators. While the block diagram in FIG. 14 illustrates a single band portable phone, it can also be applied to multi-band portable phones, e.g., dual-band, triple-band, and quad-band portable phones, and is not limited particularly to the embodiment.

As one example of the seventh embodiment, the transmitter filter 78 with a transmission frequency Tx of 1.85 GHz to 1.91 GHz and the receiver filter 79 with a receiving frequency Rx of 1.93 GHz to 1.99 GHz, each being constituted by a film bulk acoustic wave resonator filter composed of plural film bulk acoustic wave resonators, are now explained.

Figure 15:
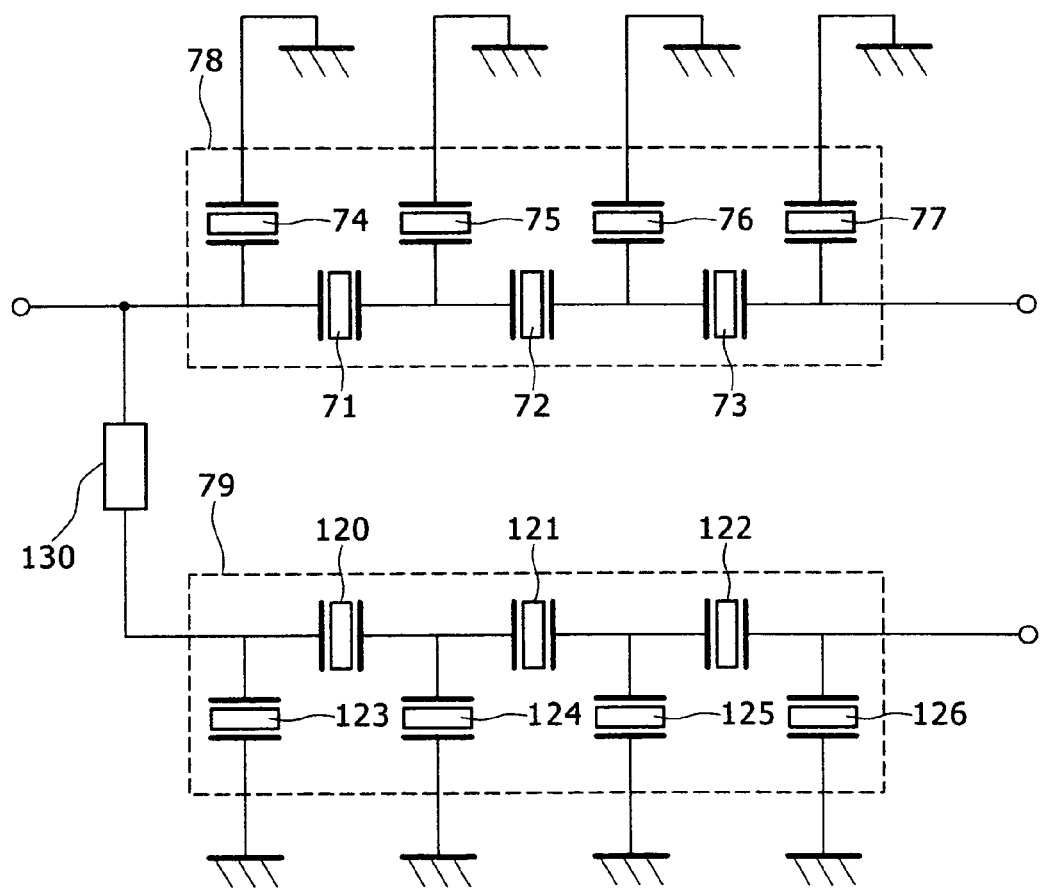
FIG. 15 is a circuit block diagram for a transmitter filter and a reception filter formed of wires of a film bulk acoustic wave resonator in the front end portion shown in FIG. 14.

FIG. 15 illustrates one example of a circuit block diagram of the duplexer module 160 shown in FIG. 14. The transmitter filter 78 is composed of an array of film bulk acoustic wave resonators 71 to 77 which are enclosed with dotted lines, and the receiver filter 79 is composed of an array of film bulk acoustic wave resonators 120 to 126 enclosed with dotted lines, respectively. The arrays of resonators shown here are for illustrative purposes only and can be varied according to desired filter characteristics, so they are not limited to the particular array shown in this embodiment. As for the phase shifter 130, any of conventional circuits, for example, an inductor, a conductor, or a λ/4 transmission circuit, can be adapted.

Figure 16:
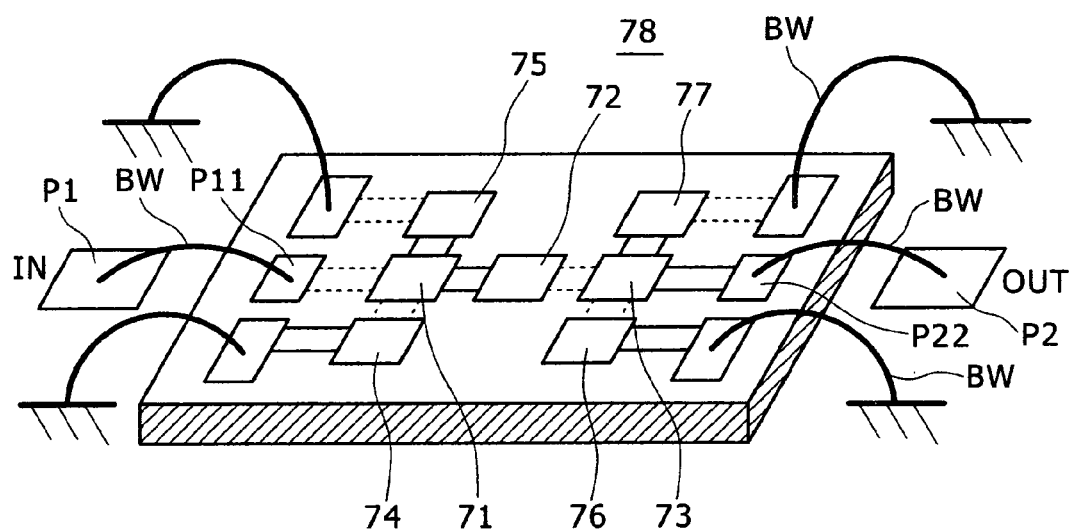
FIG. 16 is a schematic outer perspective view of a transmitter filter composed of a film bulk acoustic wave resonator that is fabricated on a single substrate.

FIG. 16 is a schematic outer perspective view of the transmitter filter 78 fabricated on a single substrate for example. Although the film bulk acoustic wave resonators 71-77 in square form, they are limited to that particular shape because the configuration of a film bulk acoustic wave resonator is determined according to desired filter characteristics. The film bulk acoustic wave resonators 71-73 have serial resonator connection, while the film bulk acoustic wave resonators 74-77 have parallel resonator connection. In FIG. 16, the solid lines between film bulk acoustic wave resonators denote wires that are connected to upper electrode layers of the film bulk acoustic wave resonators, and the dotted lines denote wires that are connected to lower electrode layers of the film bulk acoustic wave resonators.

Reference numeral P1 indicates an input wiring pad to which a transmit signal is sent. The input wiring pad is connected, via a bonding wire BW, to an input pad P11 of the filter that is connected to the film bulk acoustic wave resonator 71 of the transmitter filter 78, and further to an output pad P22 of the filter via the film bulk acoustic wave resonators 72 and 73 that are serially connected with electrode wires. The output pad P22 of the filter and a pad P2 connected to an antenna (not shown) are connected with a bonding wire BW. A wiring pad connected to the upper electrode layers of the film bulk acoustic wave resonators 74 and 76 and a wiring pad connected to the lower electrode layers of the film bulk acoustic wave resonators 75 and 77 are connected to a ground pad (not shown) (that is, they are grounded) respectively with bonding wires BW. In this manner, the transmitter filter 78 represented by the circuit diagram of FIG. 15 is formed on a single substrate. While this embodiment used bonding wires B2 for connections in the internal circuit and the transmitter filter, it is needless to say that other methods such as bump bonding can also be applied and the present invention is not particularly limited thereto.

What is claimed is:

1. A film bulk acoustic wave resonator, comprising:
  a laminate structure, which includes a piezoelectric layer, and first and second electrode layers interposing at least part of a main surface and part of a counter surface facing the main surface of the piezoelectric layer, formed on an insulating substrate;
  a first wire electrode electrically connected to the first electrode layer;
  a second wire electrode electrically connected to the second electrode layer; and
  an air gap, which is formed in the insulating substrate and which has an opening on a surface side of the insulating substrate,
  wherein one of the first and second wire electrodes is connected to the insulating substrate, and
  wherein the laminate structure is connected to the insulating substrate by interposing a prop that is formed in the air gap.

2. The film bulk acoustic wave resonator according to claim 1,
  wherein the first electrode layer is disposed above the insulating substrate,
  wherein the piezoelectric layer is disposed on the first wire electrode,
  wherein the second electrode layer is disposed on the piezoelectric layer, and
  wherein the second electrode layer has a hole without an electrode layer to form the second electrode layer at a location in the second electrode layer, the location being found in a place where a virtual line extended from the prop crosses the second electrode layer.

3. The film bulk acoustic wave resonator according to claim 2, wherein a diameter of the hole, hu, and a diameter of the prop, d, satisfy a condition of hu>d.

4. The film bulk acoustic wave resonator according to claim 1,
wherein the first electrode layer is disposed above the insulating substrate,
wherein the piezoelectric layer is disposed on the first wire electrode,
wherein the second electrode layer is disposed on the piezoelectric layer,
wherein the first electrode layer has a first hole without a electrode layer to form the first electrode layer at a location in the first electrode layer, the location being found in a place where a virtual line extended from the prop crosses the first electrode layer, and
wherein the second electrode layer has a second hole without an electrode layer to form the second electrode layer at a location in the second electrode layer, the location being found in a place where a virtual line extended from the prop crosses the second electrode layer.

5. The film bulk acoustic wave resonator according to claim 4, wherein a diameter of the first hole, hd, diameter of the second hole, hu, and a diameter of the prop, d, satisfy a condition of hu>hd>d.

6. The film bulk acoustic wave resonator according to claim 1, wherein the prop is made of a material of the insulating substrate.

7. The film bulk acoustic wave resonator according to claim 2, wherein the prop is made of a material of the insulating substrate.

8. The film bulk acoustic wave resonator according to claim 1, wherein the prop is formed of a conducting material and used as a wire electrode electrically connecting the first electrode layer, rather than the second electrode layer, which is formed on the side of the insulating substrate.

9. The film bulk acoustic wave resonator according to claim 2, wherein the prop is formed of a conducting material and used as a wire electrode electrically connecting the first electrode layer, rather than the second electrode layer, which is formed on the side of the insulating substrate.

10. The film bulk acoustic wave resonator according to claim 1, wherein a withdrawal direction of the first wire electrode and a withdrawal direction of the second wire electrode are opposite form each other.

11. A film bulk acoustic wave resonator, comprising:
a laminate structure, which includes a piezoelectric layer, and first and second electrode layers interposing at least part of a main surface and part of a counter surface facing the main surface of the piezoelectric layer, formed on an insulating substrate;
a first wire electrode electrically connected to the first electrode layer;
a second wire electrode electrically connected to the second electrode layer; and
an air gap, which is formed in the insulating substrate and which has an opening on a surface side of the insulating substrate,
wherein one of the first and second wire electrodes is connected to the insulating substrate,
wherein both the first wire electrode and the second wire electrode are arranged on one side of the laminate structure with respect to a virtual central line that equally divides the area of the laminate structure, and
wherein the laminate structure is connected to the insulating substrate by interposing a prop that is formed in the air gap.

12. The film bulk acoustic wave resonator according to claim 11,
wherein the first electrode layer is disposed above the insulating substrate,
wherein the piezoelectric layer is disposed on the first wire electrode,
wherein the second electrode layer is disposed on the piezoelectric layer, and
wherein the second electrode layer has a hole without an electrode layer to form the second electrode layer at a location in the second electrode layer, the location being found in a place where a virtual line extended from the prop crosses the second electrode layer.

13. A fabrication method of a film bulk acoustic wave resonator, comprising the steps of:
preparing an insulating substrate;
forming a groove on a surface side of the insulating substrate and a prop inside the groove;
depositing a sacrificial layer in the groove and on a surface of the insulating substrate;
planarizing the sacrificial layer to fill the groove with the sacrificial layer;
depositing a support layer on the sacrificial layer and on the surface of the insulating substrate;
depositing a first electrode layer on the support layer;
patterning the first electrode layer to a predetermined shape by etching;
depositing a piezoelectric layer on the patterned first electrode layer and on the support layer;
depositing a second electrode layer on the piezoelectric layer;
patterning the second electrode layer and the piezoelectric layer to a predetermined shape by etching; and
removing the sacrificial layer and forming an air gap with the prop in the groove.

14. A film bulk acoustic wave resonator filter, comprising;
a duplexer module including a transmitter filter and a receiver filter;
a radio-frequency integrated circuit including a transmission mixer and a receiving mixer;
a power amplifier module; and
a base band,
wherein the transmitter filter and the receiver filter each include at least one of the film bulk acoustic wave resonators, comprising:
a laminate structure, which includes a piezoelectric layer, and first and second electrode layers interposing at least part of a main surface and part of a counter surface facing the main surface of the piezoelectric layer, formed on an insulating substrate;
a first wire electrode electrically connected to the first electrode layer;
a second wire electrode electrically connected to the second electrode layer; and
an air gap, which is formed in the insulating substrate and which has an opening on a surface side of the insulating substrate,
wherein one of the first and second wire electrodes is connected to the insulating substrate, and
wherein the laminate structure is connected to the insulating substrate by interposing a prop that is formed in the air gap.

15. The film bulk acoustic wave resonator filter according to claim 14, wherein the transmitter filter and the receiver filter each include first film bulk acoustic wave resonators for which a plurality of the film bulk acoustic wave resonators are connected in series, and second film bulk acoustic wave resonators for which a plurality of the film bulk acoustic wave resonators are connected in parallel, the first and second film bulk acoustic wave resonators being connected in a ladder configuration.

16. The film bulk acoustic wave resonator according to claim 1, wherein a side periphery of the laminate structure is disposed above the insulating substrate within an area corresponding to the air gap.

17. The film bulk acoustic wave resonator according to claim 11, wherein a side periphery of the laminate structure is disposed above the insulating substrate within an area corresponding to the air gap.

18. The film bulk acoustic wave resonator according to claim 14, wherein a side periphery of the laminate structure is disposed above the insulating substrate within an area corresponding to the air gap.

* * * * *